United States Patent [19]
Ha

[11] Patent Number: 5,297,079
[45] Date of Patent: Mar. 22, 1994

[54] MEMORY DEVICES HAVING NAND TYPE CELLS USING BOTH REFERENCE CELLS AND DUMMY CELLS

[75] Inventor: Chang W. Ha, Ichonkun, Rep. of Korea

[73] Assignee: Hyundai Electronics Industries Co., Ltd., Kyoungkido, Rep. of Korea

[21] Appl. No.: 952,043

[22] Filed: Sep. 28, 1992

[30] Foreign Application Priority Data

Sep. 27, 1991 [KR] Rep. of Korea ............... 1991-16946

[51] Int. Cl.$^5$ .................................................. G11C 7/00
[52] U.S. Cl. .............................. 365/182; 365/189.01; 365/210
[58] Field of Search .................. 365/182, 185, 189.01, 365/189.07, 189.09, 200

[56] References Cited

U.S. PATENT DOCUMENTS

| | | | |
|---|---|---|---|
| 4,223,394 | 3/1980 | Pathak et al. | 365/210 |
| 4,633,443 | 12/1986 | Childers | 365/203 |
| 4,641,284 | 2/1987 | Suzuki | 365/210 |
| 5,091,888 | 2/1992 | Akaogi | 365/210 |
| 5,218,570 | 6/1993 | Pascucci et al. | 365/210 |

*Primary Examiner*—Eugene R. LaRoche
*Assistant Examiner*—Tan Nguyen
*Attorney, Agent, or Firm*—Darby & Darby

[57] ABSTRACT

A memory devices having NAND type cells as storage elements is disclosed. The amplifier prevents the error from occurring and improves the sensing speed by getting the column line and the reference line approximately the same current level for a while, after the equalizing signal was just turned into row level, in order that the potentials of the column line and the reference line normally come out without time delay. And, the sensing amplifier comprises a reference cell string selecting part 203 connected to a reference line and to selection lines 1 to N, a reference cell part 204 connected to row lines 1 to N and to the reference cell string selecting part 203, a column dummy cell part 205 connected to a column line and to dummy lines 1 and 2, a reference dummy cell part 206 connected to the reference line and to the dummy lines 1 and 2.

17 Claims, 8 Drawing Sheets

MEMORY DEVICES HAVING NAND TYPE CELLS USING BOTH REFERENCE CELLS AND DUMMY CELLS

BACKGROUND OF THE INVENTION

The present invention relates to the field of sensing amplifiers in semiconductor memory devices, and more particularly to a sensing amplifier for read only memory devices or the like which employ NAND type cells as storage elements.

The prior art regarding the sensing amplifier for memory devices will be described with reference in FIG. 1 to FIG. 5.

As shown in FIG. 1, a conventional formation of NAND type cells was composed of a large number of MOSFET's. The first MOSFET which the gate thereof connected to a selection line and the drain thereof connected to a column line has been utilized as a cell for selecting a cell string, the others which each gate thereof connected to one of the row lines 1 to N in order to select a cell, each drain thereof connected to a source of one adjoined cell and each source thereof connected to a drain of the other adjoined cell forming into a serial cell string have been utilized as unit storage elements.

In the NAND type cells, a cell as a unit storage element was able to have a positive threshold voltage of approximately a range of 0.5 volts to 2.0 volts or a negative threshold voltage of approximately not more than −0.5 volts, and a low level voltage of approximately zero volts was applied to the gate of selected unit storage element, on the contrary, high level voltage of approximately 5 volts was applied to the gate of unselected unit storage element. Therefore, the column line became an electric charged state or an electric discharged state in accordance with the states of cells.

Generally, the sensing amplifier of the prior art having two inputs connected to a column line and a reference line respectively has sensed the state of selected NAND type cells by amplifying the potential difference between two inputs, wherein the reference line had a potential approximately equal to the middle potential between charged state potential and discharged state potential of the column line.

FIG. 2 is a block diagram for explaining a memory device having a cell sensing amplifier of the prior art. As shown in FIG. 2, to maintain the uniform potential of the reference line which was approximately equal to the middle potential between the two states of the column line, dummy cells C1' to Cn' which are the same as the cells C1 to Cn connected to the column line were connected to the reference line. And, to maintain the uniform charged potential or discharged potential of the column line, each of the column line and the reference line was independently connected to a biasing circuit composed of the same number of MOSFET's, in which the first MOSFET group was coupled to the column line connected to the non-inverting input of an amplifier, and the second MOSFET group was coupled to the reference line connected to the inverting input of the amplifier. Therefore, the column line and the reference line had got the same immunity over against outer noise and process change, thus the state of the cells was fully sensed although small voltage difference was merely occurred on the column line in contrast with the reference line. This type of sensing amplifier is disclosed in U.S. Pat. No. 4,223,394.

Also, another type, in which dummy cells connected to the reference line are different from the cells connected to the column line, has been utilized in order to make the reference load.

FIG. 3 is a schematic circuit diagram for illustrating an improved sensing amplifier of the recent prior art. In FIG. 3, a reference numeral 101 denotes a cell string selecting part, 102 a memory part, 103 a reference cell string selecting part, 104 a reference cell part, 105 an added reference cell part, 106 and 107 preamplifying parts, 108 an equalizing part, and 109 denotes an amplifying part, respectively.

According to the increasing memory cells in large scale integrated memory device, the delay time of row lines was seriously increased. So, the memory device of the recent prior art as shown in FIG. 3, employed the NAND type cells and a sensing amplifier for rapid sensing the state of memory cells. The memory device was composed of a cell string selecting part 101 connected to the column line and to selection lines 1 to N, a memory part 102 connected to row lines 1 to N and to the cell string selecting part 101, a reference cell string selecting part 103 connected to the reference line and to the selection lines 1 to N, a reference cell part 104 connected to the row lines 1 to N and to the reference cell string selecting part 103, an added reference cell part 105 connected to the reference line, a preamplifying part 106 connected to the column line, a preamplifying part 107 connected to the reference line, an equalizing part 108 connected to the column line and to the reference line, and an amplifying part 109 connected to the two preamplifying parts 106 and 107.

The cell string selecting part 101 was composed of a large number of MOSFET's(n) of which each drain was connected to the column line, and each gate was connected to one of the selection lines 1 to N. The memory part 102 was composed of a very large number of MOSFET's(n×n) forming a large number of cell strings(n) in which respective drains of the first MOSFET's were connected to the respective sources of MOSFET's in the cell string selecting part 101, respective gates of MOSFET's(n×n) were connected to the row lines 1 to N respectively in order to select the cells each cell string, and the sources and drains of adjoined MOSFET's were connected to each other in order to form the serial cell strings. The reference cell string selecting part 103 was composed of a large number of MOSFET's(n) of which each drain was connected to the reference line, and each gate was connected to one of the selection lines 1 to N. The reference cell part 104 was composed of a very large number of MOSFET's(n×n) forming a large number of reference cell strings(n) wherein respective drains of the respective first MOSFET's were connected to the respective sources of MOSFET's in the reference cell string selecting part 103, respective gates of all MOSFET's(n×n) were connected to the row lines 1 to N respectively in order to select the cells each reference cell string, and the sources and drains of adjoined MOSFET's were connected to each other in order to form the serial reference cell strings. The added reference cell part 105 was composed of a large number of MOSFET's in which a drain of first MOSFET was connected to the reference line, and the other sources and drains of the MOSFET's were mutually connected to the adjoined MOSFET's in order to form a serial cell string, which performs a function of applying to the reference line a uniform potential. The first preamplifying part 106 was connected to the column line, which performs a function of preamplifying the applied potential of the column line. The second preamplifying part 107 was connected to the reference line, which performs a function of preamplifying the applied potential of the reference line in order to make the applied potential into a standard potential. The equalizing part 108 was connected to the column line and to the reference line, which performs a function of equalizing the two lines. The amplifying part 109 was respectively connected to the first and the second preamplifying parts 106 and 107, which performs a function of operational amplifying the difference of the preamplified potentials between two inputs.

That is to say, in the memory device having NAND type cells, the cells of the reference cell string selecting part 103 and the reference cell part 104 which were arranged in the same formation as the cells connected the column line in order to get the same immunity, and another cell string 105 was further added to the reference line in order to get the uniform potential.

FIG. 4 and FIG. 5 are timing diagrams showing a plot of voltage vs. time for nodes in the circuit of FIG. 3. In FIG. 4 and FIG. 5, a reference mark PRE denotes a precharging signal applied to the first and the second preamplifying parts 106 and 107, an EQ denotes an equalizing signal applied for the equalizing part 108, a SAOUT denotes an output signal from the amplifying part 109, and a t1 denotes a duration from an address inputting time to an output signal outputting time, wherein the outputting time is the time when the output signal is just coming out from the amplifying part 109, respectively.

Now, referring to FIG. 4, there is shown a timing diagram in the case that the selected unit storage element connected to the column line had a positive threshold voltage of approximately 0.5 to 2.0 volts, wherein the signals of the column line and the reference line were started separating each other from the time when the equalizing signal EQ was just turned into low level.

Referring to FIG. 5, there is shown another timing diagram in the case that the selected unit storage element connected to the column line had a negative threshold voltage not more than −0.5 volts. In this case, on the other hand the signal of the column line was gradually rising, the signal of the reference line was gradually falling for a little, while after the equalizing signal EQ was just turned into low level, for that reason, the signal of the column line had higher potential than the signal of the reference line for a little while. And then, according to elapsing of time, the signal of the column line was gradually falling and the signal of the reference line was gradually rising, at last the signals were normally separated.

Exactly, after the equalizing signal EQ was just turned into low level, the current flowing through the reference line was about the same as a sum of the current flowing on the reference load and the current flowing on the cell connected to the reference line, in order that the cell could be changed from turn-on state to turn-off state according as the potential of selected column line was changed into zero volts from 5 volts and the potential of unselected column line was changed into 5 volts from zero volts. At this time the current flowing through the column line was the about same as only current flowing on the selected cell which was changing from turn-off state to turn-on state. So, the current flowing through the reference line was bigger than the current flowing through the column line until the cell connected to the reference line turned-off, and the potential of the column line was higher than the potential of the reference line for a little while, and then, according to elapsing of time the potentials were gradually separating into normal potentials for the column line and reference line.

Therefore, the sensing amplifier for memory devices having NAND type cells of the prior art had problems that, as shown in FIG. 5, an error was occurred on the output signal of the cell sensing amplifier for a while, and sensing speed was badly delayed because the transition period had existed until the output was perfectly stabilized.

SUMMARY OF THE INVENTION

It is an object of the present invention to provide a sensing amplifier for memory devices having NAND type cells which prevents the error from occurring for a while and remarkably improves the sensing speed by getting the column line and the reference line approximately the same current level for a while, after the equalizing signal was just turned into row level, in order that the potentials of the column line and the reference line normally come out without time delay.

To achieve the object of the present invention, a sensing amplifier for memory devices having NAND type cells comprises a column line to which a plurality of NAND type cells are connected; a reference line to which a reference potential is applied; a reference cell string selecting means connected to said reference line for selecting each reference cell string; a reference storage means connected to said reference cell string selecting means and to a plurality of row lines in the memory device for providing a reference potential; first and second dummy lines to which signals varying with address transitions are applied; a column dummy cell means connected to a power source, to said column line and to said first and second dummy lines for providing a potential to said column line; a reference dummy cell means connected to the power source, to said reference line and to said first and second dummy lines for providing a potential to said reference line; a first preamplifying means connected to said column line for preamplifying the applied potential; a second preamplifying means connected to said reference line for preamplifying the applied potential; an equalizing means connected to said column and to said reference line for equalizing the potentials; and an amplifying means connected to said first and second preamplifying means for amplifying potential difference.

BRIEF DESCRIPTION OF THE DRAWINGS

In order to be more fully understood, the present invention is illustrated by way of example and not limitation in the figures of the accompanying drawings, in which.

DETAILED DESCRIPTION OF THE PREFERRED EMBODIMENTS

As an embodiment of the invention, a sensing amplifier for memory devices having NAND type cells is disclosed. In the following description, numerous specific details such as specific threshold voltages or the like are set forth to provide a thorough understanding of the present invention. However, it will be obvious to one skilled in the art that the invention may be practiced without these specific details.

Figure 1:
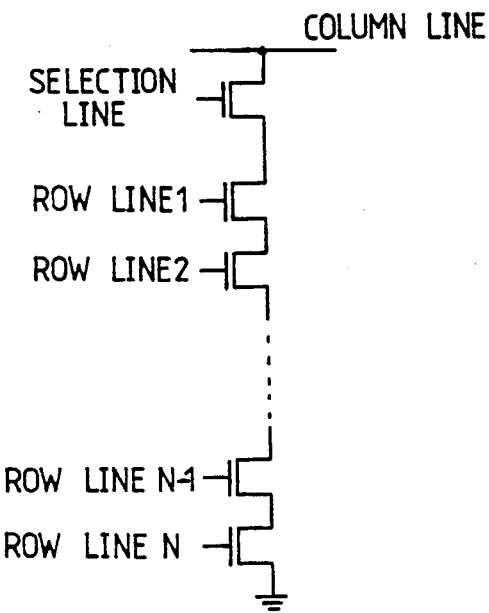
FIG. 1 is a schematic circuit diagram of a conventional formation of NAND type cells.
Figure 2:
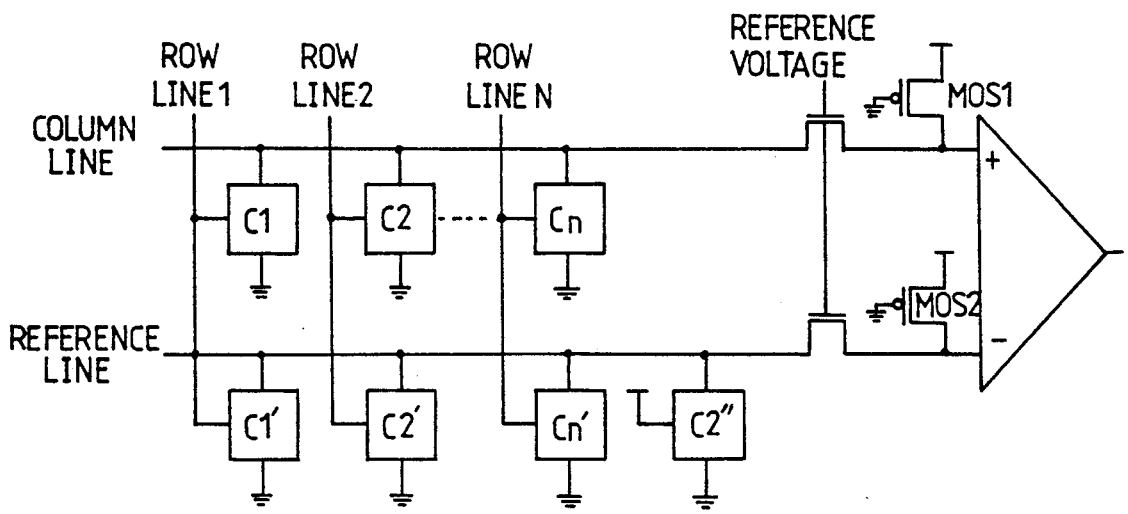
FIG. 2 is a block diagram for illustrating a memory device having a cell sensing amplifier of the prior art.
Figure 3:
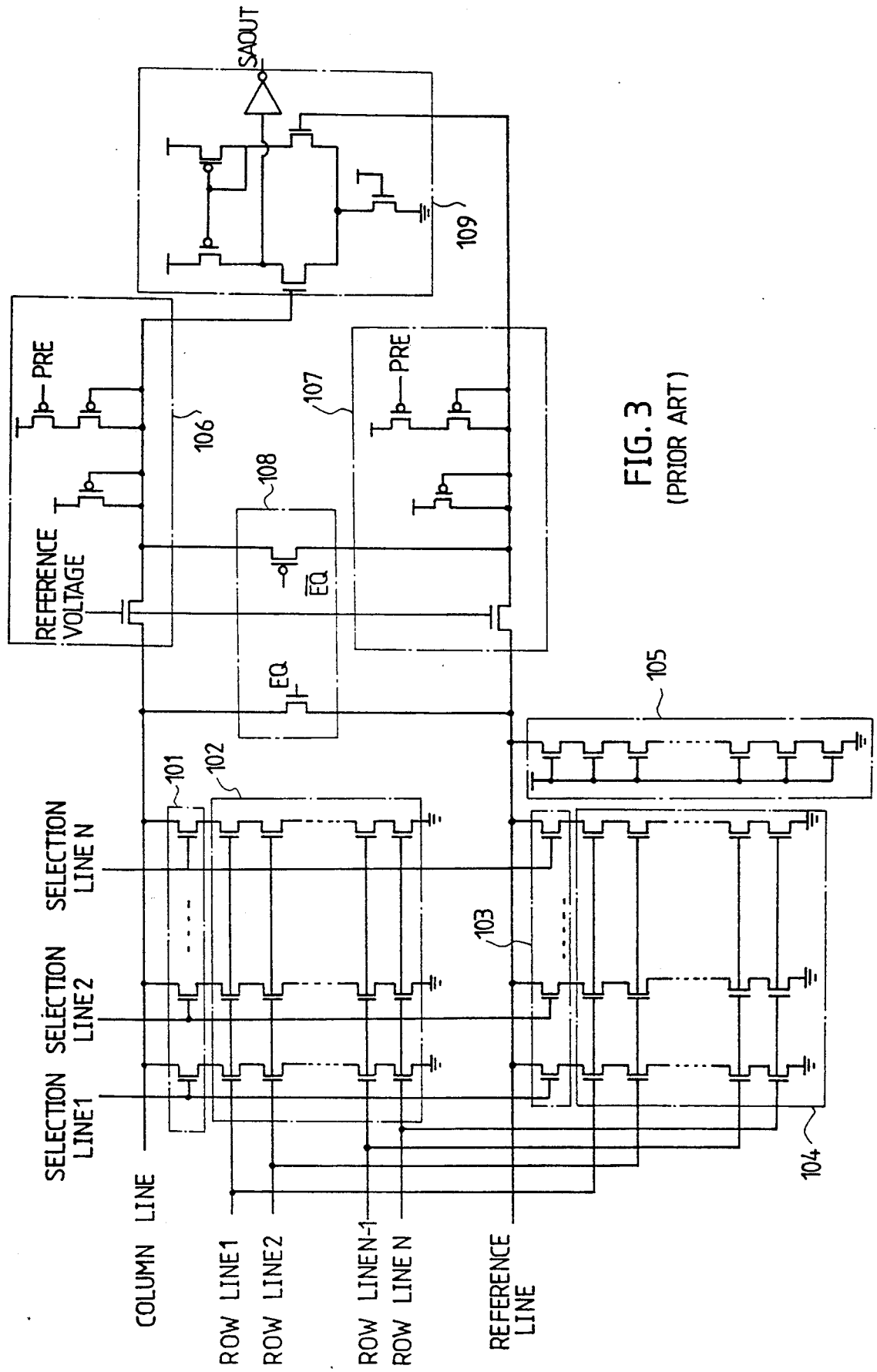
FIG. 3 is a schematic circuit diagram for illustrating an improved sensing amplifier of the prior art.
Figure 4:
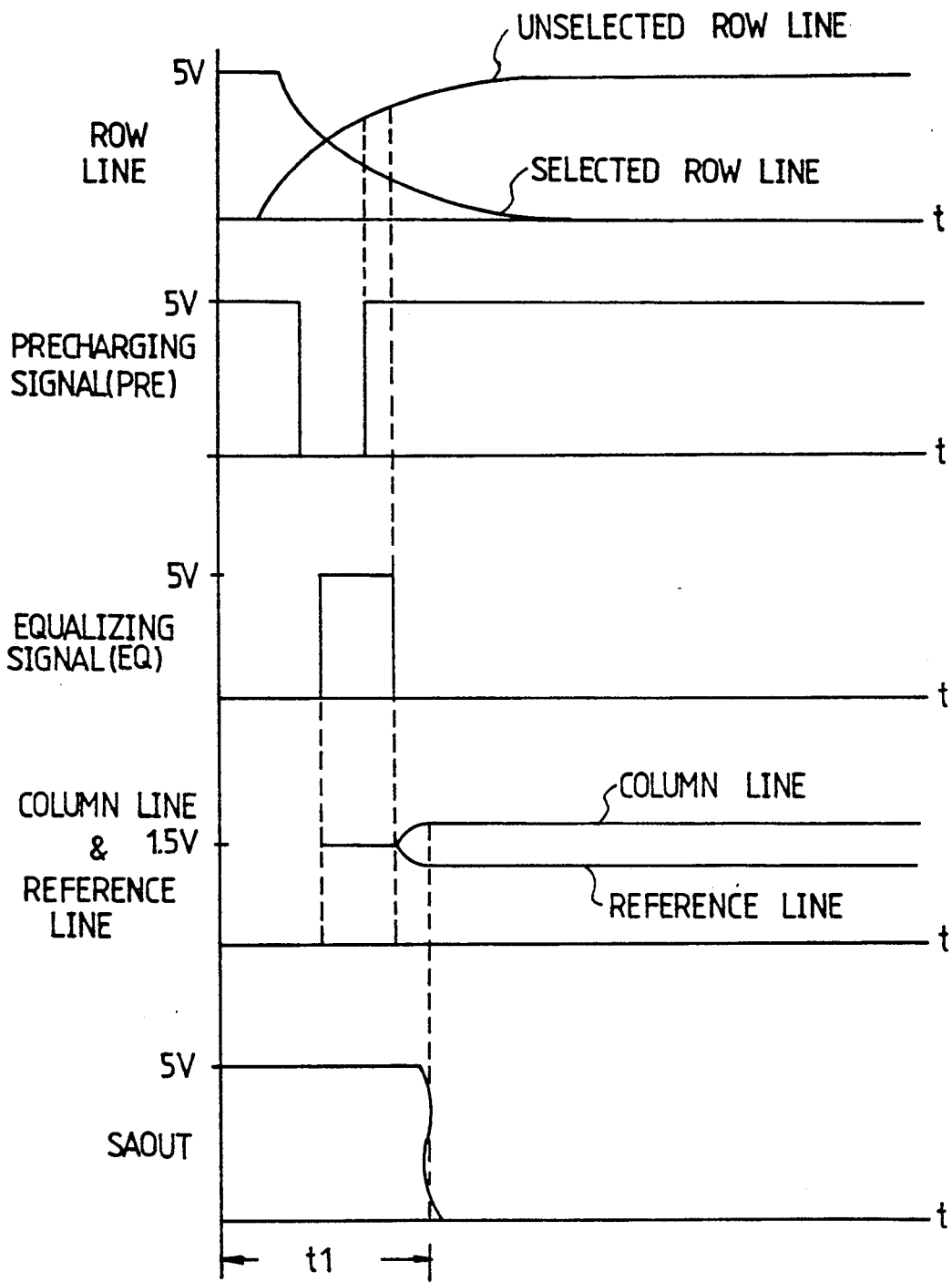
FIG. 4 and FIG. 5 are timing diagrams showing a plot of voltage vs. time for nodes in the circuit of FIG. 3.
Figure 5:
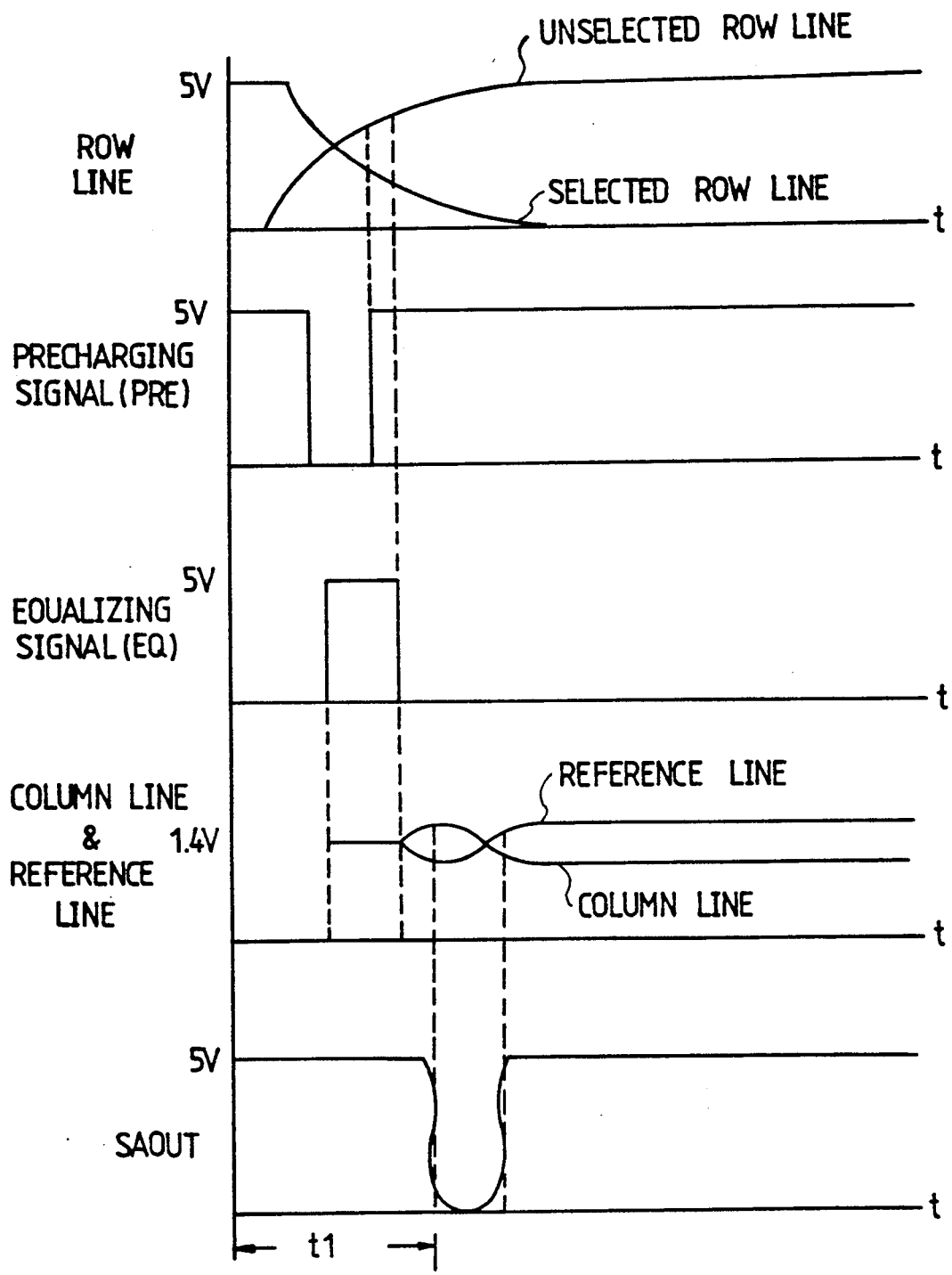
Figure 6:
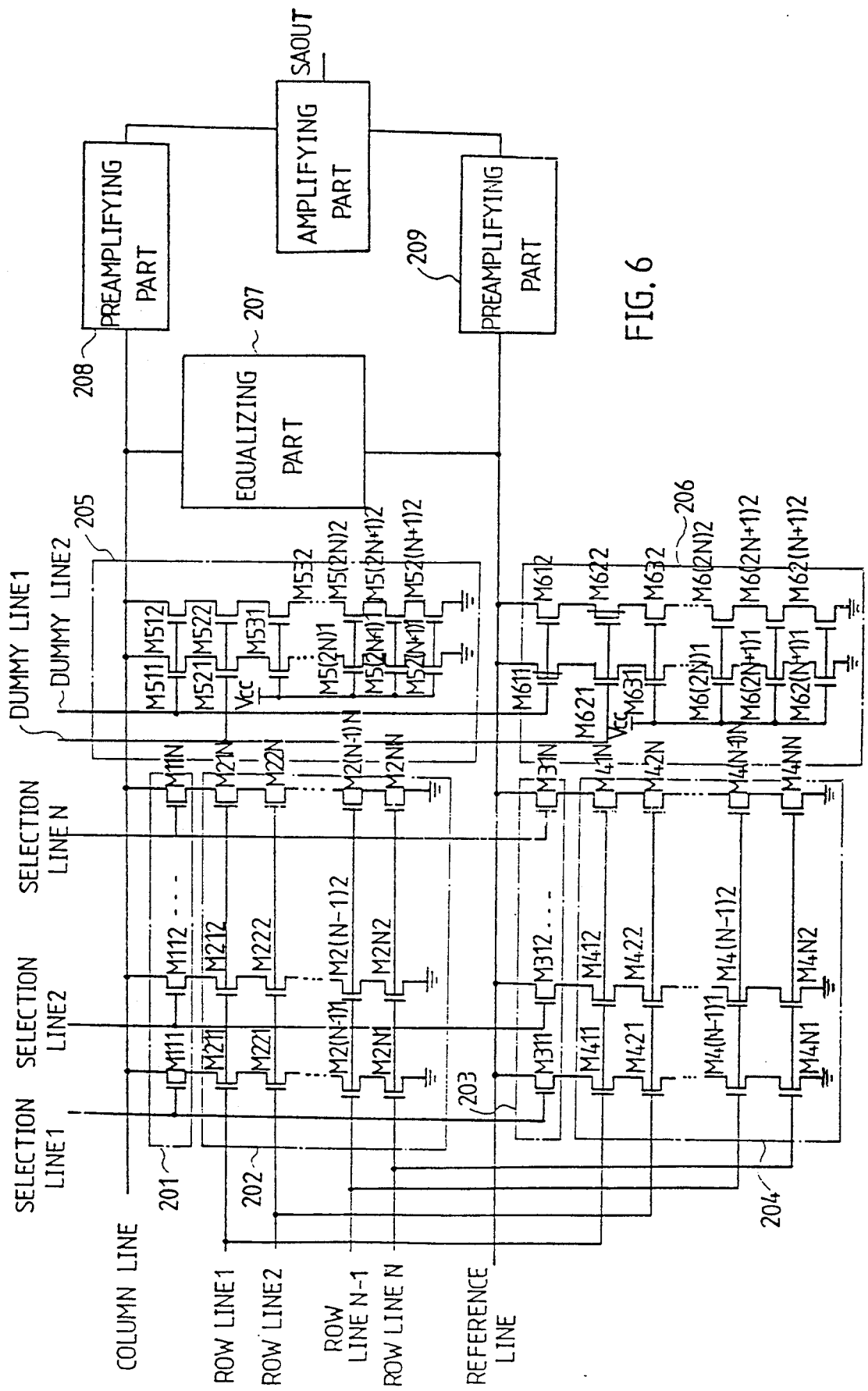
FIG. 6 is a schematic circuit diagram of an embodiment of a sensing amplifier for memory devices having NAND type cells according to the present invention.

Now, referring to FIG. 6, there is shown an embodiment of a sensing amplifier for memory devices having NAND type cells according to the invention. In FIG. 6, a reference numeral 201 denotes a cell string selecting part, 202 a memory part, 203 a reference cell string selecting part, 204 a reference cell part, 205 a column dummy cell part, 206 a reference dummy cell part, 207 an equalizing part, 208 and 209 preamplifying parts, and 210 denotes an amplifying part, respectively.

As shown in FIG. 6, the sensing amplifier of the present invention is applied for a NAND type memory device which has a cell string selecting part 201 and a memory part 202, and the sensing amplifier comprises a reference cell string selecting part 203 connected to the reference line and to the selection lines 1 to N, a reference cell part 204 connected to the row lines 1 to N and to the reference cell string selecting part 203, a column dummy cell part 205 connected to the column line and to dummy lines 1 and 2, a reference dummy cell part 206 connected to the reference line and to the dummy lines 1 and 2, an equalizing part 207 connected to the column line and to the reference line, a preamplifying part 208 connected to the column line, a preamplifying part 209 connected to the reference line, and an amplifying part 210 connected to the two preamplifying parts 208 and 209.

The cell string selecting part 201 is composed of a large number of MOSFET's M111 to M11N of which each drain is connected to the column lines, and respective gates one by one are connected to the respective selection lines 1 to N. The memory part 202 is composed of a very large number of MOSFET's M211 to M2NN forming a large number of cell strings in which respective drains of the respective first MOSFET's M211 to M21N one by one are connected to the respective sources of MOSFET's M111 to M11N in the cell string selecting part 201, respective gates of MOSFET's M211 to M2NN one by one are connected to the respective row lines 1 to N in order to select the cells each cell string, and the sources and drains of adjoined MOSFET's are connected to each other in order to form the serial cell strings. The reference cell string selecting part 203 is composed of the same number of MOSFET's M311 to M31N as the cell string selecting part 201 of which each drain is connected to the reference line, and respective gates one by one are connected to the respective selection lines 1 to N. The reference cell part 204 is composed of the same number of MOSFET's M411 to M4NN forming a large number of reference cell strings as the memory part 202, in which respective drains of the MOSFET's M411 to M41N one by one are connected to the respective sources of MOSFET's M311 to M31N in the reference cell string selecting part 203, respective gates of MOSFET's M411 to M4NN having positive threshold voltage of approximately a range of 0.5 volts to 2.0 volts one by one are connected to the respective row lines 1 to N in order to select the cells each reference cell string, and the sources and drains of adjoined MOSFET's are connected to each other in order to form the serial reference cell strings. The column dummy cell part 205 is composed of two MOSFET's M511 and M512 of which each drain is connected to the column line, and each gate is connected to a dummy line 2 which varies directly as the waveform transition of the selected row line (or the unselected row line), two MOSFET's M521 and M522 of which respective drains one by one are connected to the respective sources of MOSFET's M511 and M512, and each gate is connected to a dummy line 1 which varies directly as the waveform transition of the unselected row line (or the selected row line), and a large number of MOSFET's M531 to M52(N+1)2 of which respective drains of MOSFET's M531 and M532 one by one are connected to the respective MOSFET's M521 and M522, and respective gates are connected to a power source, and the sources and drains of adjoined MOSFET's are connected to each other in order to form two serial dummy cell strings. And also, the MOSFET's M511 to M52(N+1)2 have positive threshold voltage of approximately a range of 0.5 volts to 2.0 volts. The reference dummy cell part 206 is composed of two MOSFET's M611 and M612 of which each drain is connected to the reference line, and each gate is connected to the dummy line 2 which varies directly as the waveform transition of the selected row line (or the unselected row line), two MOSFET's M621 and M622 of which respective drains one by one are connected to MOSFET's M611 and M612, and each gate is connected to the dummy line 1 which varies directly as the waveform transition of the unselected row line (or the selected row line), and the same number of MOSFET's M631 to M62(N+1) as the column dummy cell part 205 in which respective drains of MOSFET's M631 and M632 one by one are connected to the respective MOSFET's M621 and M622, and respective gates are connected to a power source respectively, and the sources and the drains of adjoined MOSFET's are connected to each other in order to form two serial dummy cell strings. In the reference dummy cell part 206, the MOSFET's M611 and M622 only have negative threshold voltage of approximately not more than −0.5 volts, and the others have positive threshold voltage of approximately a range of 0.5 volt to 2.0 volts, otherwise the MOSFET's M612 and M621 only have the negative threshold voltage, and the others have the positive threshold voltage.

In the presently preferred embodiment, on the other hand MOSFET's M511, M512, M521 and M522 connected to the dummy lines 1 and 2 in the column dummy cell part 205 have the positive threshold voltage, in the reference dummy cell part 206 only two MOSFET's M611 and M612, or M612 and M621 connected to the dummy lines 1 and 2 have the negative threshold voltage. Therefore, if the dummy lines 1 and 2 are set in order to get the opposite polarity each other, the two dummy cell strings connected to the column line are turned-off and one of the two dummy cell strings connected to the reference line is turned-on in accordance with the states of dummy lines 1 and 2. And, the MOSFET's N111 to M11N, M211 to M2NN, M311 to M31N, M411 to M4NN, M511 to M52(N+1)3, and M611 to M62(n+1)2 which are employed in the preferred embodiment can be formed single poly type MOSFET's or floating poly type MOSFET's.

The first preamplifying part 208 is connected to the column line, which performs a function of preamplifying the potential applied to the column line. The second preamplifying part 209 is connected to the reference line, which performs a function of preamplifying the potential applied to the reference line in order to make the potential into a standard potential. The equalizing part 207 respectively is connected to the column line and to the reference line, which performs a function of equalizing two potentials applied to column line and reference line. The amplifying part 210 respectively is connected to the first and the second preamplifying parts 208 and 209, which performs a function of operational amplifying the difference in the preamplified potentials applied to two inputs.

Figure 7:
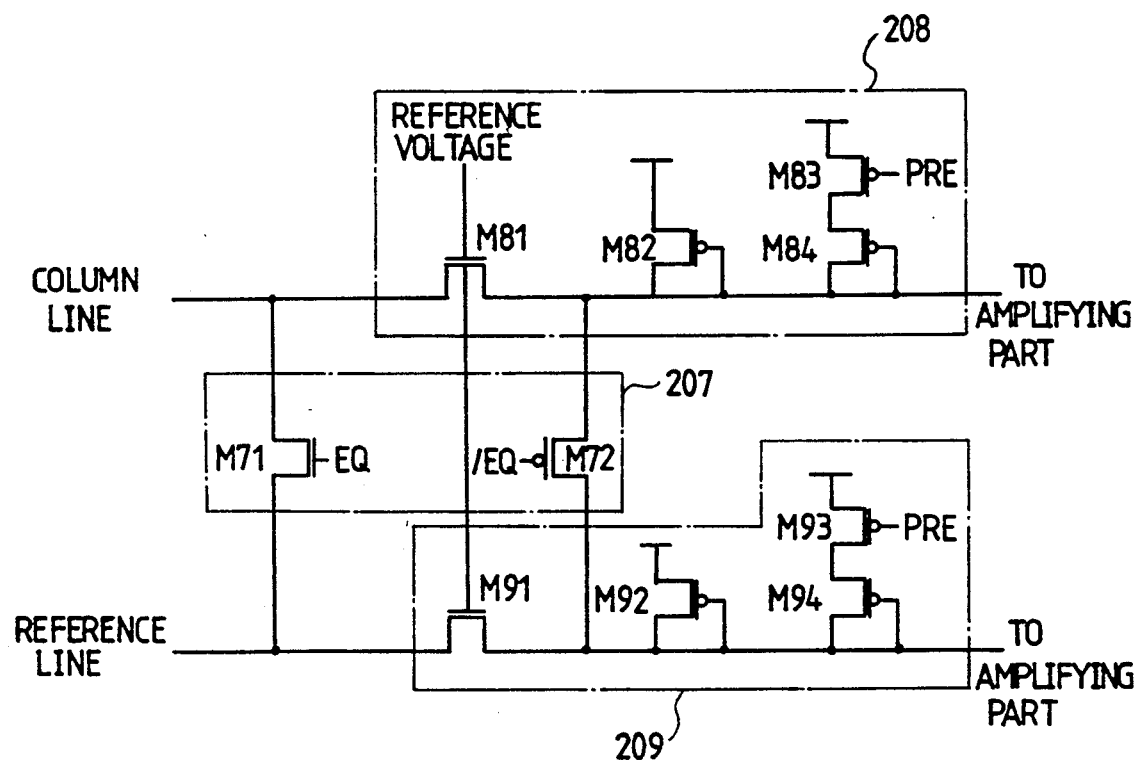
FIG. 7 is a schematic circuit diagram of an equalizing part and first and second preamplifying parts and a equalizing part in FIG. 6.

FIG. 7 is a schematic circuit diagram of the equalizing part 207 and the first and the second preamplifying parts 208 and 209 in FIG. 6. In the presently preferred embodiment, the equalizing part 207 comprises two MOSFET's M71 and M71 of which each drain is connected to the column line, each source is connected to the reference line, and the equalizing signals EQ and $\overline{EQ}$ respectively are applied to the gates thereof. The first preamplifying part 208 comprises a MOSFET M81 of which the drain and the source are connected to between the drains of the MOSFET's M71 and M72 and a reference potential is applied to the gate thereof, a p channel MOSFET M82 of which the drain and the source are connected to between a power source and the MOSFET M81 and a potential of the source is applied to the gate thereof, a p channel MOSFET 83 of which the source is connected to a power source and a precharging signal PRE is applied to the gate thereof, and a p channel MOSFET M84 of which the source is connected to the drain of MOSFET M83 and a potential of the drain is applied to the gate thereof, which amplifies the potential applied to the column line for sensing the states of cells. The second preamplifying part 209 comprises a MOSFET M91 of which the drain and the source are connected to between the sources of the MOSFET's M71 and M72 and a reference potential is applied to the gate thereof, a p channel MOSFET 92 of which the drain and the source are connected to between a power source and the MOSFET 91 and a potential of the source is applied to the gate thereof, a p channel MOSFET 93 of which the source is connected to a power source and a precharging signal PRE is applied to the gate thereof, and a p channel MOSFET 94 of which the source is connected to the drain of MOSFET 93 and a potential of the drain is applied to the gate thereof, which amplifies the potential applied to the reference line into a standard potential predetermined.

Figure 8:
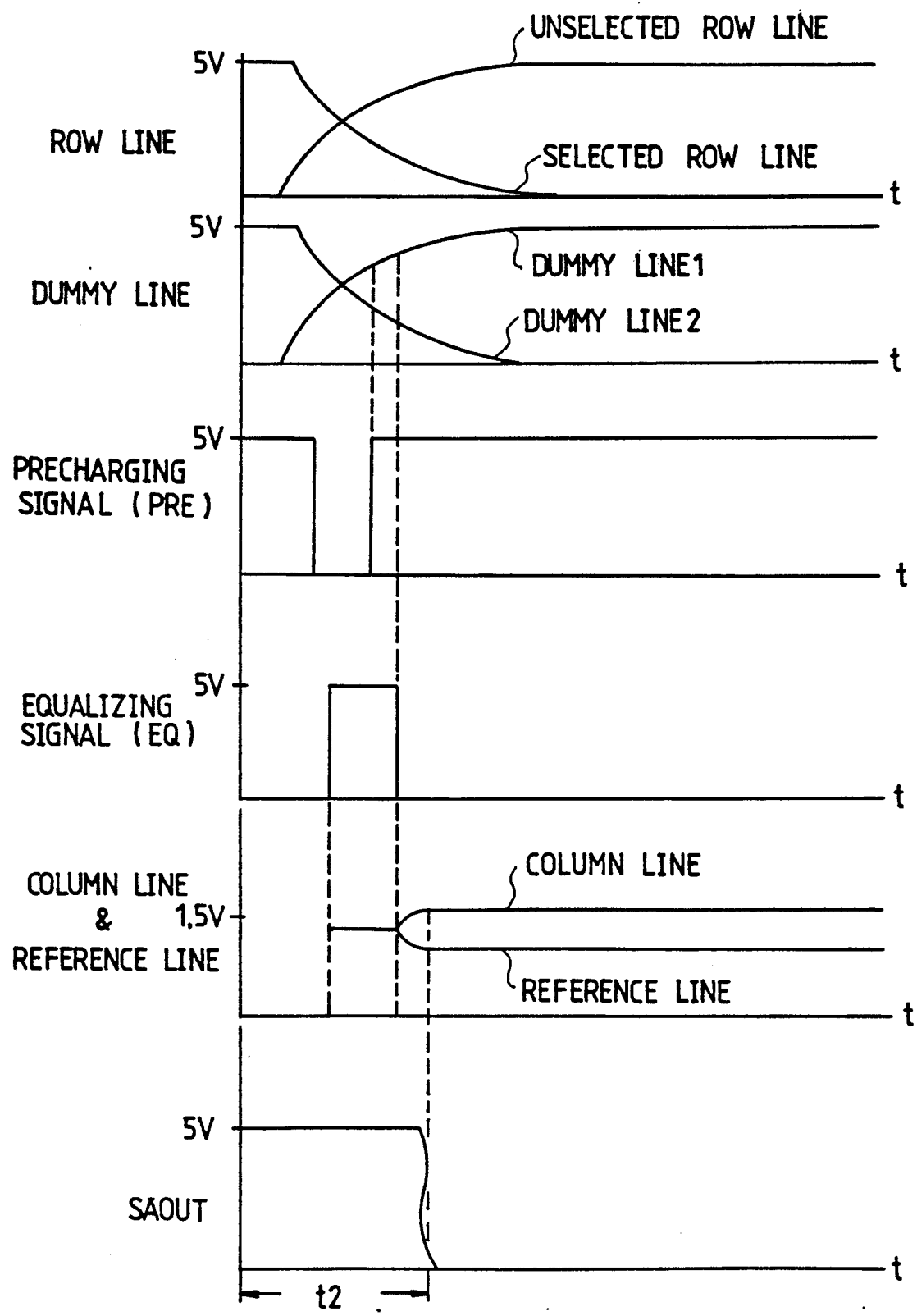
FIG. 8 and FIG. 9 are timing diagrams showing a plot of voltage vs. time for nodes in the circuits of FIG. 6 and FIG. 7.
Figure 9:
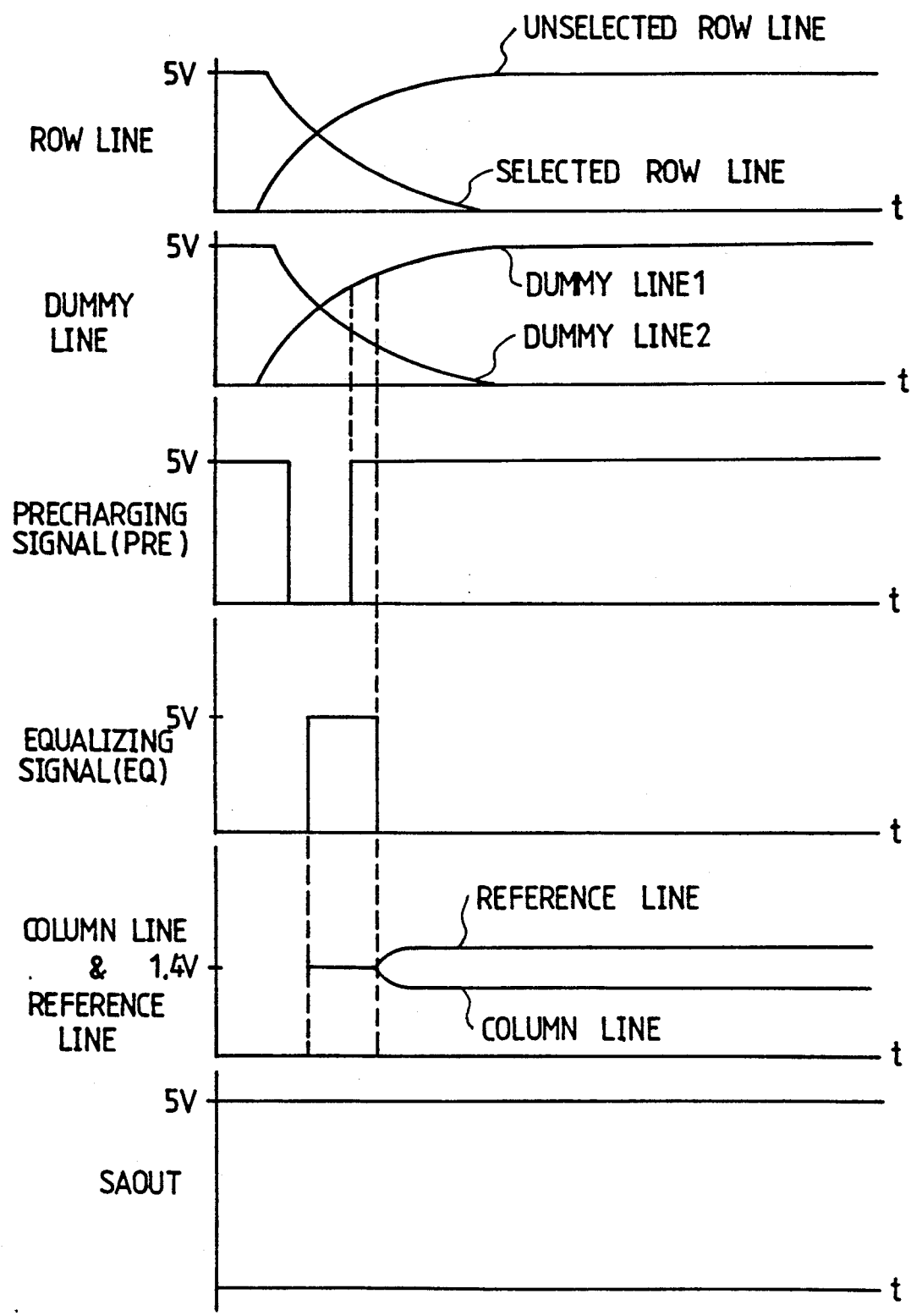

FIG. 8 and FIG. 9 are timing diagrams showing a plot of voltage vs. time for nodes in the circuits of FIG. 6 and FIG. 7. In FIG. 8 and FIG. 9, a reference mark PRE denotes a precharging signal applied to the first and the second preamplifying parts 208 and 209, an EQ denotes an equalizing signal applied to the equalizing part 207, a SAOUT denotes an output signal from the amplifying part 210, and a t2 denotes a duration from an address inputting time to an output signal outputting time, wherein the outputting time is the time when the output signal SAOUT is just coming out from the amplifying part 210, respectively.

FIG. 8 is shown a timing diagram of the preferred embodiment according to the invention of which the selected unit storage element connected to the column line has a positive threshold voltage of approximately a range of 0.5 to 2.0 volts, and FIG. 9 is shown a timing diagram of the another preferred embodiment according to the invention of which the selected unit storage element connected to the column line has a negative threshold voltage of approximately not more than −0.5 volt.

Now, referring to FIG. 8 and FIG. 9, the notable action of the present invention may be illustrated as follows. As shown in FIG. 6, the same formation of dummy cell parts 205 and 206 are additionally arranged to the column line and reference line. In particular, a pair of MOSFET's M611 and M622 (or M612 and M621) of which respective gates one by one are connected to the respective dummy lines 1 and 2 must be employed as depletion N type MOSFET's in the reference dummy cell part 206. And, the waveform transitions of the dummy lines 1 and 2 are alternately changed from high to low (or from low to high) as like the waveform transitions of the selected row lines (or unselected row lines), every time when the address transition is occurred.

Accordingly, until the selected row line and unselected row line become completely steady states from the equalizing signal EQ turned into low, the dummy line 1 and 2 have the transition stages of approximately a range of zero volts to 5 volts too. So, the current flowing the column line is approximately equal to the reference line.

According as the row lines are gradually steadied in accordance with elapsing of time, the dummy lines 1 and 2 become equally steady states too. At this time the current flowing of the column line only is equal to the current of selected cell, because the current flowing of the two dummy cell strings is approximately zero amperes.

Also, an uniformed reference load is formed in the reference line because the cells in the reference cell string selecting part 203 and the reference cell part 204 of which respective drains are connected to the reference line and respective gates one by one are connected to the respective row lines 1 to N are turned-off, and only one of the two dummy cell strings is turned-on. The reason why the only one dummy cell strings must be turned-on, the MOSFET's M611 and M622, or the MOSFET's M612 and M621 must be turned-on in accordance with the polar states of the dummy lines 1 and 2. So, the time delay of the row lines is equal to the time delay of the dummy lines, and the waveform transitions of the two lines are equalled.

Therefore, the sensing amplifier according to the present invention can apply to memory devices having NAND type cells, and provides an effect of increasing the cell sensing speed by preventing the error from occurring.

What is claimed is:

1. A memory device having NAND type cell, comprising:
a column line to which a plurality of NAND type cells are connected;

a reference line to which a reference potential is applied;

a reference cell string selecting means connected to said reference line for selecting each reference cell string;

a reference storage means connected to said reference cell string selecting means and to a plurality of row lines in the memory device for providing a reference potential;

first and second dummy lines to which signals varying with address transitions are applied;

a column dummy cell means connected to a power source, to said column line and to said first and second dummy lines for providing a potential to said column line;

a reference dummy cell means connected to the power source, to said reference line and to said first and second dummy lines for providing a potential to said reference line;

a first preamplifying means connected to said column line for preamplifying the applied potential;

a second preamplifying means connected to said reference line for preamplifying the applied potential;

an equalizing means connected to said column and to said reference line for equalizing the potentials; and an amplifying means connected to said first and second preamplifying means for amplifying potential difference.

2. A memory device according to claim 1, wherein said reference cell string selecting means comprises:

a plurality of MOSFET's of which respective drains are connected to said reference line and respective gates are connected to respective selection lines in the memory device.

3. A memory device according to claim 2, wherein each MOSFET of said reference cell string selecting means in a single ploy type MOSFET.

4. A memory device according to claim 2, wherein each MOSFET of said reference cell string means is a floating poly type MOSFET.

5. A memory device according to claim 1, wherein said reference storage means comprises:

a plurality of MOSFET's for forming a large number of reference cell strings of which respective drains of respective first MOSFET in each reference cell string thereof are connected to said reference cell string selecting means and respective gates of all MOSFET's are connected to the respective row lines, and sources and drains of adjoined MOSFET's are connected each other.

6. A sensing amplifier according to claim 5, wherein each MOSFET of said reference storage means is a single poly type MOSFET.

7. A memory device according to claim 5, wherein each MOSFET of said reference storage means is a floating poly type MOSFET.

8. A memory device according to claim 5, wherein each MOSFET of said reference storage means has a threshold voltage of a range of 0.5 volts to 2.0 volts.

9. A memory device according to claim 1, wherein said column dummy cell means comprises:

first and second MOSFET's of which respective drains are connected to said column line, and respective gates are connected to said second dummy line;

third and fourth MOSFET's of which respective drains are connected to said first and the second MOSFET's, and respective gates are connected to said first dummy line;

fifth and sixth MOSFET's of which respective gates are connected to a power source, and respective drains are connected to said third and the fourth MOSFET's; and a plurality of MOSFET's of which respective gates are connected to a power source, and respective drains are connected to the adjoined MOSFET's for forming a first and a second dummy cell strings.

10. A memory device according to claim 9, wherein each MOSFET of said column dummy cell means is a single poly type MOSFET.

11. A memory device according to claim 9, wherein each MOSFET of said column dummy cell means is a floating poly type MOSFET.

12. A memory device according to claim 9, wherein each MOSFET of said column dummy cell means has a threshold voltage of a range of 0.5 volts to 2.0 volts.

13. A memory device according to claim 1, wherein said reference dummy cell means comprises:

first and second MOSFET's of which respective drains are connected to said reference line, and respective gates are connected to said second dummy line;

third and fourth MOSFET's of which respective drains are connected to said first and said second MOSFET's, and respective gates are connected to said first dummy line;

fifth and sixth MOSFET's of which respective gates are connected to a power source, and respective drains are connected to said respective third and said fourth MOSFET's; and a plurality of MOSFET's of which respective gates are connected to a power source, and respective drains are connected to adjoined MOSFET's for forming a first and a second dummy cell strings.

14. A memory device according to claim 13, wherein each MOSFET of said reference dummy cell means is a single poly type MOSFET.

15. A memory device according to claim 13, wherein each MOSFET of said reference dummy cell means is a floating poly type MOSFET.

16. A memory device according to claim 13, wherein said first and fourth MOSFET's have threshold voltages of not more than −0.5 volts, and said other MOSFET's have threshold voltages of a range of 0.5 volts to 2.0 volts.

17. A memory device according to claim 13, wherein said second and third MOSFET's have threshold voltages of not more than −0.5 volts, and said other MOSFET's have threshold voltages of a range of 0.5 volts to 2.0 volts.

* * * * *